(12) United States Patent
Yamaguchi et al.

(10) Patent No.: US 10,378,100 B2
(45) Date of Patent: Aug. 13, 2019

(54) SPUTTERING APPARATUS AND RECORDING MEDIUM FOR RECORDING CONTROL PROGRAM THEREOF

(71) Applicant: CANON ANELVA CORPORATION, Kawasaki-shi (JP)

(72) Inventors: Nobuo Yamaguchi, Kawasaki (JP); Koji Tsunekawa, Kawasaki (JP); Naoki Watanabe, Kawasaki (JP); Motomu Kosuda, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 983 days.

(21) Appl. No.: 14/575,244

(22) Filed: Dec. 18, 2014

(65) Prior Publication Data
US 2015/0101927 A1    Apr. 16, 2015

Related U.S. Application Data

(62) Division of application No. 12/934,497, filed as application No. PCT/JP2009/060911 on Jun. 16, 2009, now abandoned.

(30) Foreign Application Priority Data

Jun. 25, 2008 (JP) ................. 2008-165718

(51) Int. Cl.
C23C 14/34 (2006.01)
C23C 14/22 (2006.01)
C23C 14/54 (2006.01)

(52) U.S. Cl.
CPC ........ *C23C 14/3492* (2013.01); *C23C 14/225* (2013.01); *C23C 14/3407* (2013.01); *C23C 14/54* (2013.01)

(58) Field of Classification Search
CPC .............. C23C 14/3492; C23C 14/225; C23C 14/3407; C23C 14/54
See application file for complete search history.

(56) References Cited

U.S. PATENT DOCUMENTS

| 5,660,930 A | 8/1997 | Bertero et al. |
| 6,207,499 B1 | 3/2001 | Hoshi |

(Continued)

FOREIGN PATENT DOCUMENTS

| JP | 60-81821 A | 5/1985 |
| JP | 61-161708 | 7/1986 |

(Continued)

OTHER PUBLICATIONS

Translation to Terao (JP 61-161708) published Jul. 1986.*

(Continued)

*Primary Examiner* — John J Brayton
(74) *Attorney, Agent, or Firm* — Venable LLP (57) ABSTRACT

Disclosed is a sputtering apparatus having a target (2) disposed offset with respect to a substrate (7), wherein the uniformity of a deposition amount can be ensured even when a substrate support holder (6) has a low number of rotations of several rotations to several tens of rotations and the amount of deposition is extremely small to provide such a film thickness of 1 nm or less.
A control unit (11) is provided to control a rotational velocity V (rps) of the substrate support holder (6) to satisfy:

$$V \cdot T = N + \alpha$$

by inputting the value of a deposition time T and the values of a total whole number of rotations N and a fractional number of rotations α which are expressed as:

$$X = N + \alpha$$

(Continued)

(where, N is the total whole number of rotations which is a positive whole number, and α is the fractional number of rotations which is a positive pure decimal) when the total number of rotations of the substrate support holder (6) is X during the deposition time T (seconds) of sputtering particles onto a film forming surface of the substrate (7).

15 Claims, 7 Drawing Sheets

(56) References Cited

U.S. PATENT DOCUMENTS

| | | | |
|---|---|---|---|
| 6,238,531 | B1 | 5/2001 | Pinarbasi |
| 6,547,939 | B2 | 4/2003 | Hsuech et al. |
| 7,008,520 | B2 | 3/2006 | Takahashi |
| 7,033,461 | B2 | 4/2006 | Tani et al. |
| 7,229,532 | B2 | 6/2007 | Ando et al. |
| 7,655,549 | B2 | 2/2010 | Sunil et al. |
| 7,816,283 | B2 | 10/2010 | Wickramanayaka et al. |
| 2005/0115823 | A1 * | 6/2005 | Davis .................. C23C 14/3464 204/192.12 |
| 2005/0139467 | A1 | 6/2005 | Takahashi |
| 2006/0249372 | A1 | 11/2006 | Xiang et al. |
| 2006/0281314 | A1 | 12/2006 | Wickramayanaka et al. |
| 2008/0188100 | A1 | 8/2008 | Saitoh |
| 2008/0264775 | A1 | 10/2008 | Kitano et al. |
| 2009/0211897 | A1 | 8/2009 | Tsunekawa et al. |
| 2009/0321246 | A1 | 12/2009 | Tsunekawa et al. |
| 2010/0078310 | A1 | 4/2010 | Tsunekawa et al. |
| 2010/0080894 | A1 | 4/2010 | Tsunekawa et al. |
| 2010/0120238 | A1 | 5/2010 | Kitano et al. |
| 2010/0133092 | A1 | 6/2010 | Mashimo et al. |
| 2010/0178528 | A1 | 7/2010 | Tsunekawa et al. |
| 2010/0200394 | A1 | 8/2010 | Nagamine et al. |
| 2010/0213047 | A1 | 8/2010 | Nagamine et al. |
| 2010/0215460 | A1 | 8/2010 | Watanabe et al. |
| 2010/0224482 | A1 | 9/2010 | Yamaguchi et al. |
| 2010/0239394 | A1 | 9/2010 | Watanabe et al. |
| 2010/0243438 | A1 | 9/2010 | Yamaguchi et al. |
| 2010/0316890 | A1 | 12/2010 | Choi et al. |
| 2010/0326818 | A1 | 12/2010 | Ikemoto et al. |

FOREIGN PATENT DOCUMENTS

| | | | | |
|---|---|---|---|---|
| JP | 61161708 | A * | 7/1986 | ....... H01L 21/02546 |
| JP | 3-193867 | | 8/1991 | |
| JP | 6-81821 | | 3/1994 | |
| JP | 6-302516 | | 10/1994 | |
| JP | 2000-208876 | | 7/2000 | |
| JP | 2000-265263 | | 9/2000 | |
| JP | 2000265263 | A * | 9/2000 | |
| JP | 2001-240965 | | 9/2001 | |
| JP | 2001240965 | A * | 9/2001 | |
| JP | 2005-340721 | A | 12/2005 | |
| JP | 2006-233283 | A | 9/2006 | |
| JP | 2006-237371 | A | 9/2006 | |
| WO | 2006/077827 | A1 | 7/2006 | |

OTHER PUBLICATIONS

Translation to Takahashi (JP 2001-240965) published Sep. 2001.*
Translation to Tsunekawa (JP 2000-265263) published Sep. 2000.*
Human translation to Terao (JP 61-161708) published Jul. 1986.*
N. Mise et al., "Single Metal/Dual High-k Gate Stack with Low Vth and Precice Gate Profile Control for Highly Manufacturable Aggressively Scaled CMISFETs," IEDM Tech. Dig., pp. 527-530 (2007).
International Search Report issued in corresponding Application No. PCT/JP2009/060911 (2 pages).
International Preliminary Report on Patentability issued in corresponding Application No. PCT/JP2009/060911 (5 pages).

* cited by examiner

SPUTTERING APPARATUS AND RECORDING MEDIUM FOR RECORDING CONTROL PROGRAM THEREOF

The present application is a divisional of U.S. patent application Ser. No. 12/934,497, filed Sep. 24, 2010, now abandoned.

TECHNICAL FIELD

The present invention relates to a sputtering apparatus used for depositing a film forming material on a film forming surface of a substrate in, for example, a manufacturing process of electronic equipment such as a semiconductor device, a display device, etc. and a recording medium such as a magnetic recording medium on which a program used to control the drive of the sputtering apparatus is recorded.

BACKGROUND ART

For example, it is known to use a slanting sputtering apparatus in order to deposit a film forming material uniformly on a film forming surface of a substrate by using a target smaller than the substrate in a manufacturing process of a semiconductor device. In the slanting sputtering apparatus, a sputtering cathode for supporting the target and a substrate support holder for supporting the substrate are arranged such that a surface of the target is positioned slantly with respect to the film forming surface of the substrate. The film forming material is deposited by flight of sputtering particles to the film forming surface of the substrate from an oblique direction by rotating the substrate support holder to rotate the film forming surface of the substrate in a given plane (see, for example, Patent References 1, 2, 3, 4 and 5).

Meanwhile, since there are demands for a highly sophisticated semiconductor device, a technology of depositing a very small amount of material to provide a uniform film thickness of 10 nm or less is being demanded. For example, a technology of depositing MgO in thickness of 1 nm or less is being demanded for a transistor to lower power consumption by adjusting a threshold voltage (see, for example, Nonpatent Reference 1).

PRIOR ART REFERENCES

Patent References

Patent Reference 1: Japanese Patent Laid-open Publication No. 2000-265263
Patent Reference 2: Japanese Patent Laid-open Publication No. 2005-340721
Patent Reference 3: Japanese Patent Laid-open Publication No. 2006-237371
Patent Reference 4: Japanese Patent Laid-open Publication No. 2006-233283
Patent Reference 5: WO2006/077827

Nonpatent Reference

Nonpatent Reference 1: IEDM Tech. Dig., by N. Mise et al., p. 527 (2007)

SUMMARY OF THE INVENTION

Problems to be Solved by the Invention

When a very small amount of film forming material is deposited by a sputtering apparatus to form a film having a film thickness of 10 nm or less, and particularly 1 nm or less as described above, the deposition is completed in a short deposition time of several seconds to several tens of seconds.

Meanwhile, when it is considered to maintain a high vacuum atmosphere to keep the quality of the film, the rotational velocity of the substrate support holder is limited to about 100 rpm according to the present industrial technology. Therefore, when the deposition time is several seconds to several tens of seconds, the number of rotations of the substrate support holder is about several tens of rotations at most, and even if the number of rotations is increased to try to improve the uniformity of a deposition amount, it is difficult to increase further the number of rotations.

The present invention provides a sputtering apparatus ensuring the uniformity of a deposition amount even when the substrate support holder has a low number of rotations of several rotations to several tens of rotations and the amount of deposition is extremely small to provide a film thickness of 10 nm or less and particularly 1 nm or less.

Means for Solving the Problems

The sputtering apparatus according to the invention has a sputtering cathode for supporting a target and a substrate support holder for supporting a substrate. The sputtering cathode and the substrate support holder are disposed such that a vertical line running through the center point of the target and a vertical line running through the center point of the substrate are mismatched with each other among vertical lines to a plane including the film forming surface of the substrate. Specifically, there are a case that the film forming surface of the substrate and the surface of the target are parallel to each other and their center points are displaced from each other and a case that the film forming surface of the substrate and the surface of the target are not parallel to each other, and the positions of their center points are displaced from each other. The substrate support holder is rotatable on a rotating axis which is perpendicular to the film forming surface of the substrate. And, a control unit is provided to control a rotational velocity V (rps) of the substrate support holder so as to satisfy:

$$V \cdot T = N + \alpha$$

by inputting the value of a deposition time T and the values of a total whole number of rotations N and a fractional number of rotations α, which are expressed as:

$$X = N + \alpha$$

(where, N is a total whole number of rotations which is a positive integer, and α is a fractional number of rotations which is a positive pure decimal) when it is determined that a total number of rotations of the substrate support holder is X during the deposition time T (seconds) of sputtering particles onto the film forming surface of the substrate.

As a preferable embodiment, the sputtering apparatus according to the invention is provided with a power supply unit for supplying power to the sputtering cathode, wherein the deposition time T is a time from the start to end of supplying the power from the power supply unit to the sputtering cathode.

As a preferable embodiment, the sputtering apparatus according to the invention is also provided with a power supply unit for supplying power to the sputtering cathode and an openable/closable shutter disposed between the sputtering cathode and the substrate support holder, wherein the deposition time T is a time when the power is supplied from the power supply unit to the sputtering cathode and the shutter is open.

The recording medium according to the invention is a recording medium on which recorded is a program for controlling a rotational velocity V (rps) of a substrate support holder of a sputtering apparatus which has a sputtering cathode for supporting a target and the substrate support holder for supporting a substrate, which are disposed to have a vertical line running through the center point of the target and a vertical line running through the center point of the substrate mismatched with each other among vertical lines with respect to a plane including a film forming surface of the substrate, and the substrate support holder is rotatable on a rotating axis perpendicular to the film forming surface of the substrate. And, the recording medium according to the invention records thereon the program for controlling the rotational velocity V of the substrate support holder by calculating $$V \cdot T = N + \alpha$$

based on the value of a deposition time T and the values of a total whole number of rotations N and a fractional number of rotations α, which are expressed as:

$$X = N + \alpha$$

(where, N is a total whole number of rotations which is a positive integer, and α is a positive pure decimal) when it is determined that the total number of rotations of the substrate support holder is X during the deposition time T (seconds) of sputtering particles onto the film forming surface of the substrate.

As a preferable embodiment, the sputtering apparatus and the recording medium according to the invention include that the deposition time T is 1 to 400 seconds, the total whole number of rotations N is 1 to 100, the rotational velocity V of the substrate support holder is 0.016 to 3.5 rps, and the fractional number of rotations α is 0.2 to 0.8.

Effects of the Invention

According to the invention, a deposit film having a film thickness of 10 nm or less such as a gate insulating film or a multilayer magnetic film and particularly a deposit film having a film thickness of 1 nm or less can be deposited uniformly on substantially the entire area of the substrate.

As a result, the present invention can provide a magnetic memory device such as a high-performance semiconductor device or a TMR (Tunneling Magneto Resistance) element.

MODE FOR CARRYING OUT THE INVENTION

Figure 1:
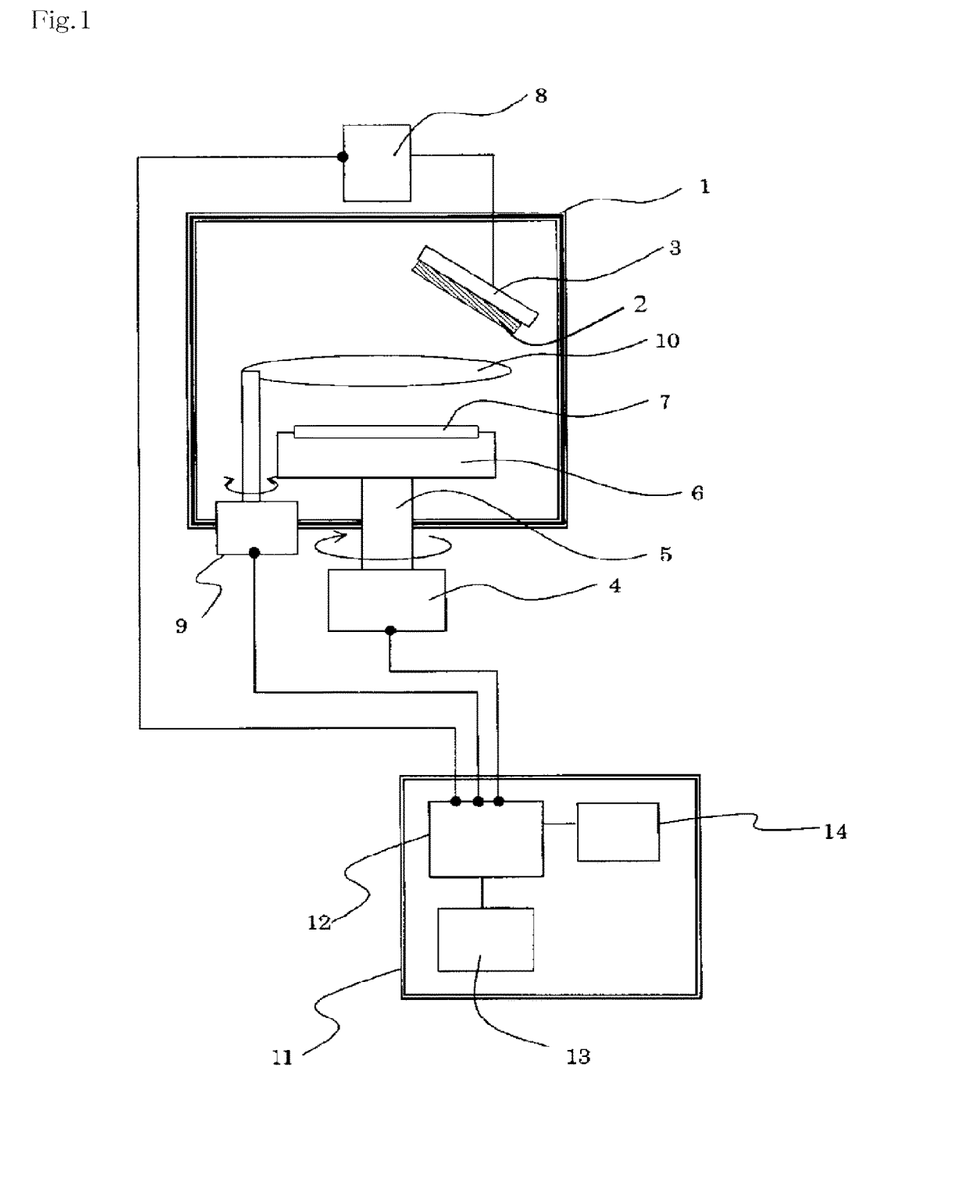
FIG. 1 is a schematic sectional view showing an example of the sputtering apparatus according to the invention.

FIG. 1 is a schematic sectional view showing an example of the sputtering apparatus according to the invention.

In the sputtering apparatus shown in FIG. 1, a sputtering cathode 3 for supporting a target 2 is disposed at a ceiling portion of a vacuum vessel 1. A substrate support holder 6 which is attached to a rotating axis 5 rotated by a rotation drive mechanism 4 is arranged at the center of a bottom surface portion of the vacuum vessel 1. The substrate support holder 6 supports horizontally a substrate 7, and the rotating axis 5 is disposed perpendicular to a film forming surface (surface exposed toward the target 2) of the substrate 7. Therefore, the substrate 7 can be rotated with the rotations of the substrate support holder 6 in a state that the film forming surface is positioned in a prescribed plane.

The substrate support holder 6 is rotated at least for a deposition time (film forming time) T (seconds) when the sputtering particles from the target 2 are deposited on the film forming surface. Since the rotational velocity V (rps) of the substrate support holder 6 is readily controlled, it is desirably kept at a fixed level during the deposition time T. But, the rotational velocity V can also be varied during the deposition time T. For example, it can also be determined during the deposition time T to have a low rotational velocity in the early period and a fast rotational velocity in the latter half period and conversely a fast rotational velocity in the early period and a low rotational velocity in the latter half period. In addition, the rotational velocity V of the substrate support holder 6 can also be varied at a rate of a direct function or a quadratic function during the deposition time T.

In the example shown in FIG. 1, the sputtering cathode 3 and the substrate support holder 6 are disposed such that the surface (the surface exposed toward the substrate 7) of the target 2 is inclined against the film forming surface of the substrate 7. Therefore, the sputtering particles directed from the target 2 to the film forming surface of the substrate 7 are deposited by entering the film forming surface from an oblique direction.

A DC power source 8 is connected as a power supply unit to the sputtering cathode 3. Prescribed DC power (e.g., 1 W to 1000 W, preferably 10 W to 750 W) can be applied from the DC power source 8 to the sputtering cathode 3. An RF power source can also be used as a power supply unit instead of the DC power source 8.

A shutter 10 which can be opened and closed by a shutter drive mechanism 9 is arranged between the sputtering cathode 3 (target 2) and the substrate support holder 6 (substrate 7). When the shutter 10 is open, the sputtering particles generated from the target 2 can be deposited on the film forming surface of the substrate 7. But, when the shutter 10 is closed, flight of the sputtering particles generated from the target 2 to the film forming surface of the substrate 7 is blocked to prevent the deposition of the sputtering particles onto the film forming surface of the substrate 7.

A control unit 11 controls the rotations of the substrate support holder 6, on and off of the DC power source 8 and open and close of the shutter 10. The control unit 11 comprises a CPU (central processing unit) 12, a recording medium 13 on which a control program is recorded and an input portion 14. As the control unit 11, a general-purpose computer can be used. The recording medium 13 is a medium on which a program described later can be recorded in a callable state, and specifically a non-volatile memory such as a hard disk, a magnet-optical disk, a flexible disk, a flash memory, MRAM or the like usable for the general-purpose computer can be used. As the input portion 14, a keyboard, a mouse, a touch panel, a voice-input means and the like can be used.

The control unit 11 controls the rotational velocity V (rps) of the substrate support holder 6 by inputting the deposition time T together with the values of the total whole number of rotations N and the fractional number of rotations α, which are expressed as:

$$X=N+\alpha$$

(where, N is a total whole number of rotations which is a positive integer, and α is a fractional number of rotations which is a positive pure decimal), when it is determined that the total number of rotations of the substrate support holder 6 is X during the deposition time T of the sputtering particles onto the film forming surface of the substrate 7.

For further description, a first digital value related to the deposition time T, a second digital value related to the total whole number of rotations N of the substrate support holder 6 within the deposition time T and a third digital value related to the fractional number of rotations α are inputted from the input portion 14 into the CPU 12 and recorded temporarily in it. These digital values can also be recorded on the recording medium 13 and read if necessary.

The CPU 12 of the control unit 11 is connected to the rotation control mechanism 4, the DC power source 8 and the shutter drive mechanism 9. The CPU 12 of the control unit 11 controls the operations of the DC power source 8 and the shutter drive mechanism 9 at the required timing and also controls the operation of the rotation control mechanism 4 in accordance with the above drive timing to control the rotational velocity V (rps) of the substrate support holder 6.

An operation command to and the control of the rotation drive mechanism 4 are performed according to the first, second and third digital values, which are temporarily recorded in the CPU 12, by reading the control program recorded on the recording medium 13. The operation command to and the control of the rotation drive mechanism 4 are executed by calculating:

$$V \cdot T = N + \alpha$$

from the individual values of the deposition time T, the total whole number of rotations N and the fractional number of rotations α which are given as the first, second and third digital values and rotating the substrate support holder 6 at the determined rotational velocity V for the prescribed deposition time T. In other words, the sputtering apparatus of the present invention controls the rotational velocity V of the substrate support holder 6 such that the total number of rotations X of the substrate holder 6 during the deposition time T is not an integer but has the fractional number of rotations α without fail.

The deposition time T according to the invention is determined from a thickness of a deposit film to be formed on the substrate 7 and a deposition speed (deposition thickness per unit time of the film forming material to the substrate 7) of the used sputtering apparatus according to the invention. The deposition speed can be determined by performing a preliminary film forming experiment under the same conditions as those for formation of the deposit film on the substrate 7. The total whole number of rotations N can be selected arbitrarily in a range that an excessive load is not applied to the rotation drive mechanism 4 depending on the ability of the rotation drive mechanism 4. And, the fractional number of rotations α can be determined by performing the preliminary film forming experiment with the fractional number of rotations α varied by adjusting the rotational velocity V of the substrate support holder 6 with the total whole number of rotations N fixed to obtain the fractional number of rotations α at which a deposit film having a film thickness as uniform as possible can be formed.

For example, the start and end points of the deposition time T can be determined as on/off timing of the power supply unit (e.g., DC power source 8), open/close timing of the shutter 10, or a combination of on/off timing of the power supply unit and open/close timing of the shutter 10 to the sputtering cathode 3.

FIG. 2 to FIG. 5 show first to fourth timing charts each showing a timing of start and end points of the deposition time T. These timing charts are described additionally referring to FIG. 1.

Figure 2:
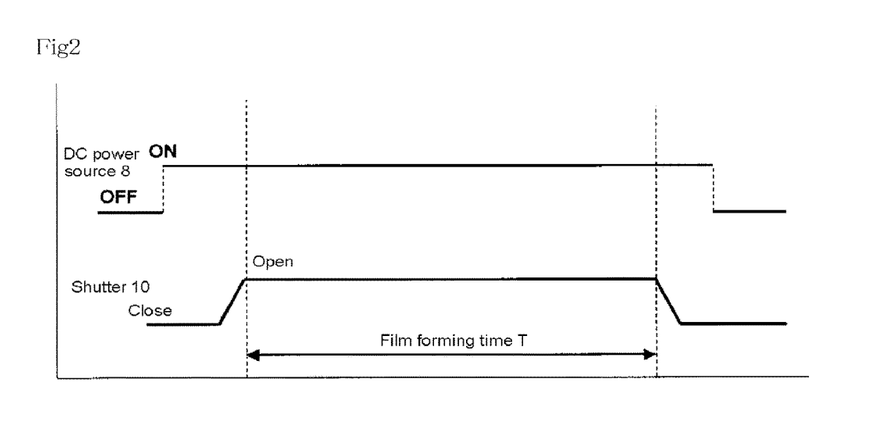
FIG. 2 is a first timing chart showing a timing of start and end points of a deposition time T.

The first timing chart of FIG. 2 shows a case that the deposition time T is determined by timings of opening and closing the shutter 10. The CPU 12 of the control unit 11 first introduces a sputtering gas into the vacuum vessel 1 of the sputtering apparatus with the shutter 10 in a closed state and turns "on" the DC power source 8 to supply a constant power to the sputtering cathode 3 to start discharge, thereby generating plasma at the front surface of the target 2. After that, the shutter drive mechanism 9 operates to open the shutter 10. The time when the opening operation of the shutter 10 is terminated (time when the shutter 10 is fully opened) is the start point of the deposition time T. And, when the deposition time T has elapsed from the termination of the opening operation of the shutter 10, the shutter drive mechanism 9 is operated again to close the shutter 10. In this case, the time of starting the closing operation of the shutter 10 is the end point of the deposition time T.

Figure 3:
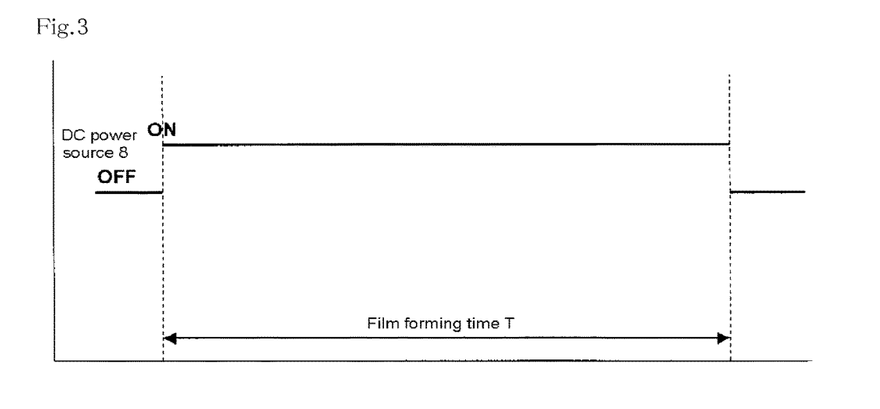
FIG. 3 is a second timing chart showing a timing of start and end points of the deposition time T.

The second timing chart of FIG. 3 shows a case that the deposition time T is determined by the on/off timing of the power supply unit (e.g., DC power source 8) to the sputtering cathode 3. This timing chart can be applied to a device not provided with the shutter 10 and a case that the sputtering apparatus is driven with the shutter 10 kept open. In the second timing chart, the time when the CPU 12 of the control unit 11 introduces a sputtering gas into the vacuum vessel 1 of the sputtering apparatus and turns "on" the DC power source 8 is the start point of the deposition time T, and the time when the DC power source 8 is turned "off" later is the end point of the deposition time T.

Figure 4:
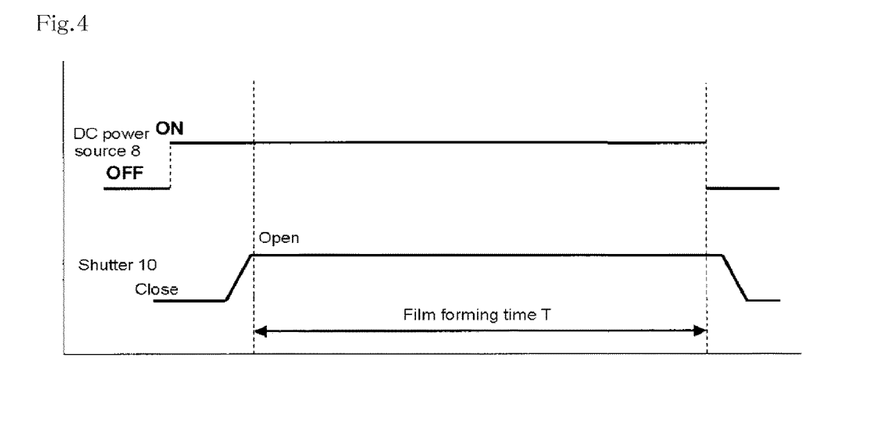
FIG. 4 is a third timing chart showing a timing of start and end points of the deposition time T.

The third timing chart of FIG. 4 shows a first example of determining the deposition time T by a combination of the on/off timing of the power supply unit (e.g., DC power source 8) and the open/close timing of the shutter 10. The start point of the deposition time T in this third timing chart is same to the start point in the first timing chart. In the third timing chart, when the deposition time T has elapsed from the start point, the DC power source 8 is turned off with the shutter 10 in the open state, and then the shutter 10 is closed. And, the time when the DC power source 8 is turned "off" is the end point of the deposition time T.

Figure 5:
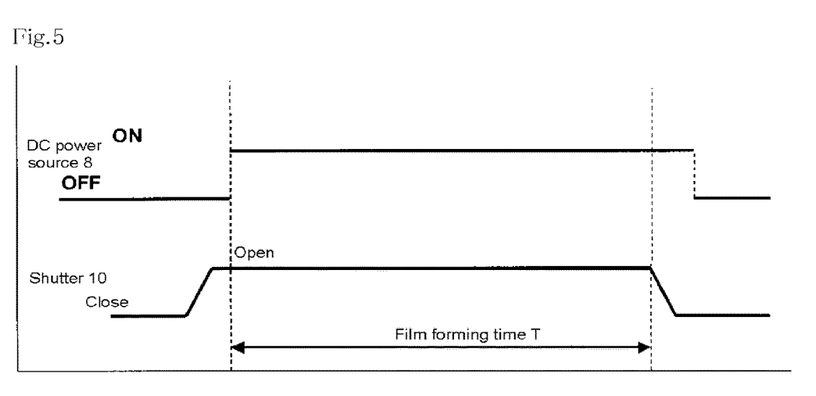
FIG. 5 is a fourth timing chart showing a timing of start and end points of the deposition time T.

The fourth timing chart of FIG. 5 shows a second example of determining the deposition time T by a combination of the on/off timing of the power supply unit (e.g., DC power source 8) and the open/close timing of the shutter 10. The CPU 12 of the control unit 11 first introduces a sputtering gas into the vacuum vessel 1 of the sputtering apparatus with the shutter 10 in the closed state and operates the shutter drive mechanism 9 to open the shutter 10. Then, the DC power source 8 is turned "on" to supply a constant power to the sputtering cathode 3 to start discharge, thereby generating plasma at the front surface of the target 2. The start point of the deposition time T in this fourth timing chart is the time when the DC power source 8 is turned "on". And, the end point of the deposition time T is same to the end point of the first timing chart.

The deposition time T according to the invention is determined as a time in which the necessary deposit film thickness is obtained, and the invention is particularly effective for formation of a thin deposit film and effective when the deposit film thickness is 10 nm or less and particularly 1 nm or less. In other words, the present invention is effective for formation of a deposit film having a short deposition time T, and the deposition time T according to the invention is preferably 1 to 400 seconds, and more preferably 1 to 30 seconds.

The rotational velocity V of the substrate support holder 6 according to the invention may be obtained by a general rotation control mechanism 4 and preferably in a range of 0.016 to 3.5 rps, and more preferably in a range of 0.05 to 2 rps. Since a very low-speed rotation requires a special system for the rotation mechanism and the control mechanism, it is preferably 0.016 rps or more from the viewpoint of the cost. To maintain a high vacuum atmosphere by a simple sealing mechanism, the rotational velocity V is preferably 3.5 rps or less. And, it is more preferably 0.05 rps or more for more stable operation. The substrate 7 is placed on the substrate support holder 6, which is accelerated from a stationary state, then the film formation is started when the substrate support holder 6 reaches a desired rotational velocity. After the film formation is terminated, the substrate support holder 6 is decelerated to return to the stationary state. Therefore, when the rotational velocity is increased, an influence on a throughput (the number of substrates per unit time processed by the apparatus) due to acceleration and deceleration time of the substrate support holder 6 increases, and when it is tried to decrease the acceleration and deceleration time, an excessive force is applied to the mechanism, and a maintenance cycle is decreased. Therefore, it is more preferable that the substrate support holder 6 has a rotational velocity V of 2 rps or less.

The total whole number of rotations N according to the invention becomes an integer of 1 or more, and generally in a range of 1 to 100 rotations, and preferably in a range of 1 to 50 rotations.

The fractional number of rotations α according to the invention is determined by the preliminary film forming experiment as described above. For example, it is determined as 0.1 rotation (deviation angle β=36 degrees), 0.2 rotation (deviation angle β=72 degrees), 0.5 rotation (deviation angle β=180 degrees), 0.15 rotation (deviation angle β=54 degrees), 0.151 rotation (deviation angle β=54.36 degrees) or the like. Generally, the fractional number of rotations α is preferably 0.1 to 0.9 rotation, and more preferably 0.2 to 0.8 rotation. The above deviation angle β denotes an amount of angular deviation with the rotating axis 5 at the center which is generated between the time of starting rotations and the time of stopping rotations at one point on the substrate support holder 6.

The material used for the target 2 of the invention includes, for example, a metal such as Hf (hafnium), Mg (magnesium), La (lanthanum), Zr (zirconium), Ta (tantalum), Ti (titanium), Al (aluminum), Co (cobalt), Fe (iron), Ni (nickel), Ru (ruthenium), Cu (copper), Pt (platinum), Mn (manganese) or Cr (chromium), an oxide such as magnesium oxide, hafnium oxide, lanthanum oxide, silicon oxide, tantalum oxide or chromium oxide, a carbide such as silicon carbide, or the like, but they are not exclusively limited. The target 2 is preferably set to have a diameter smaller than that of the substrate 7. In a preferable embodiment, the diameter of the target 2 is in a range of 0.1 to 0.9 time, and preferably 0.3 to 0.7 time, larger than the diameter of the substrate 7.

As the substrate 7 used in the present invention, for example, a silicon substrate, a gallium arsenide substrate, an AlTiC substrate, a glass substrate, a stainless substrate, an aluminum substrate, a plastic substrate and the like can be used, but they are not exclusively limited.

In the example shown in FIG. 1, the sputtering cathode 3 and the substrate support holder 6 are disposed such that the surface (surface exposed toward the substrate 7) of the target 2 is inclined with respect to the film forming surface of the substrate 7. But, the arrangement of the sputtering cathode 3 and the substrate support holder 6 according to the invention is not limited to the above. The film forming surface of the substrate 7 and the surface of the target 2 may be arranged to be parallel to each other when a vertical line running through the center point of the target 2 and a vertical line running through the center point of the substrate are mismatched with each other among vertical lines with respect to a plane including the film forming surface of the substrate 7. Arrangement examples of the sputtering cathode 3 and the substrate support holder 6 according to the invention are described below with reference to FIG. 6 and FIG. 7.

Figure 6:
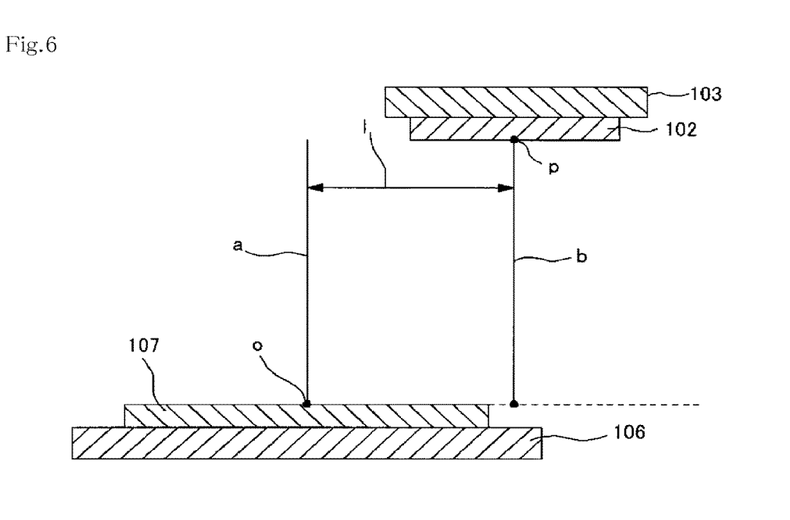
FIG. 6 is a sectional view schematically showing an arrangement relationship between a substrate support holder and a sputtering cathode according to the invention.
Figure 7:
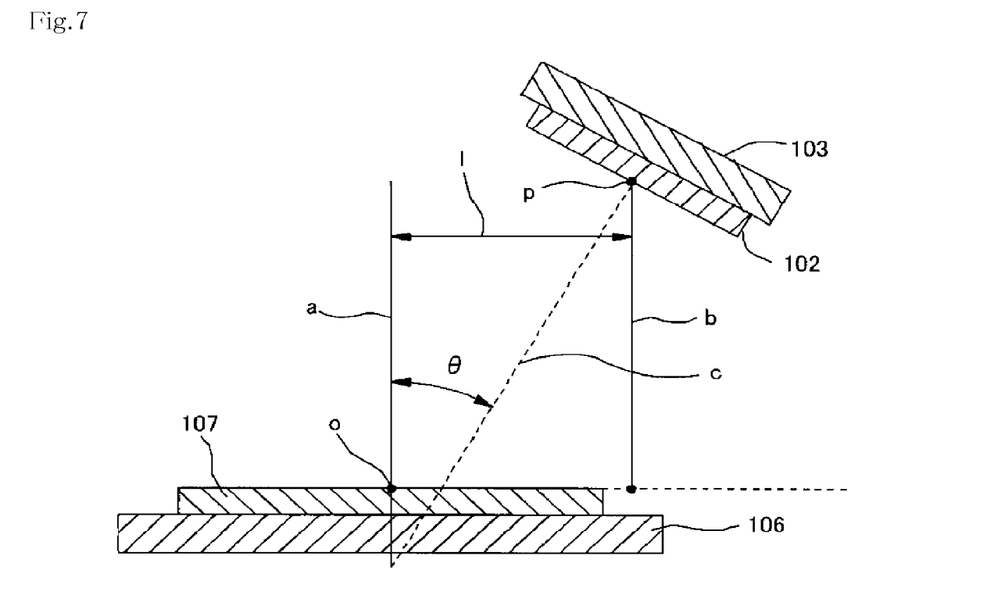
FIG. 7 is a sectional view schematically showing another arrangement relationship between a substrate support holder and a sputtering cathode according to the invention.

FIG. 6 and FIG. 7 are sectional views each schematically showing an arrangement relationship between a substrate and a target according to the invention, and members common to those of FIG. 1 are denoted by like reference numerals.

In the drawings, 102 denotes a target; 103 a sputtering cathode; 106 a substrate support holder; 107 a substrate; (a) a vertical line (substrate vertical line (a)) running through a center (o) of the substrate 107 among vertical lines with respect to a plane including the film forming surface of the substrate 107; and (b) a vertical line (substrate vertical line (b)) running through a center (p) of the target 102; and a shift amount (l) is a distance between the substrate vertical line (a) and the substrate vertical line (b). And, (c) in FIG. 7 is a vertical line (target vertical line (c)) running through the center (p) of the target 102 among vertical lines with respect to a plane including the surface of the target 102.

In the arrangement example shown in FIG. 6, the sputtering cathode 103 and the substrate support holder 106 are arranged such that the surface of the target 102 and the film forming surface of the substrate 107 are parallel to each other and the substrate vertical line (a) and the substrate vertical line (b) are not a common linear line but positioned separate from each other and are mismatched with each other. The sputtering cathode 103 and the substrate support holder 106 may be arranged such that even when the substrate vertical line (b) is arranged to become a linear line running inside the outer peripheral edge of the substrate 107, the substrate vertical line (b) becomes a linear line running outside the outer peripheral edge of the substrate 107. The shift amount (l) is preferably 50 to 800 mm, more preferably 100 to 500 mm, and much more preferably 150 to 400 mm. And, a distance from the center (p) of the target 102 to the plane including the film forming surface of the substrate 107 along the substrate vertical line (b) is preferably 50 to 800 mm, more preferably 100 to 500 mm, and much more preferably 150 to 400 mm.

In the arrangement example shown in FIG. 7, the sputtering cathode 103 and the substrate support holder 106 are arranged such that the surface of the target 102 is not parallel to the film forming surface of the substrate 107, and the substrate vertical line (a) and the substrate vertical line (b) are not a common linear line but positioned separate from each other and are mismatched with each other. A crossing angle θ between the substrate vertical line (a) and the target vertical line (c) is preferably 1 to 45 degrees, and more preferably 5 to 35 degrees. In this arrangement example, the sputtering cathode 103 and the substrate support holder 106 may also be arranged such that even when the substrate vertical line (b) is arranged to become a linear line running inside the outer peripheral edge of the substrate 107, the vertical line (B) becomes a linear line running outside the outer peripheral edge of the substrate 107. The shift amount (l) is preferably 50 to 800 mm, more preferably 100 to 500 mm, and much more preferably 150 to 400 mm. And, a distance from the center (p) of the target 102 to the plane including the film forming surface of the substrate 107 along the substrate vertical line (b) is preferably 50 to 800 mm, more preferably 100 to 500 mm, and much more preferably 150 to 400 mm.

When the substrate 107 has a circular shape like a silicon wafer, the center point (o) of the substrate 107 is the center of the circular shape, and when it has a square shape like a glass substrate, it is an intersection of two diagonal lines. When it has a shape other than the circular or square shape, the center of gravity is determined to be the center point (o). They are also same for the target 102.

EXAMPLES

Examples 1 to 4, Comparative Example 1

Using the sputtering apparatus shown in FIG. 1, Mg (magnesium) was deposited on a substrate. Film forming conditions are as follows. A deposition speed was determined by performing a preliminary film forming experiment for forming a deposit film of Mg. Specifically, deposition amounts were measured at 17 points in an area excluding an outer peripheral portion of 5 mm of a Si wafer having a diameter of 300 mm on which the Mg deposit film was formed in the same manner as the method described below, and the average of the 17 deposition amounts divided by the deposition time (film forming time) was determined as the deposition speed. And, a total whole number of rotations N was selected as a general value for ability of the rotation drive mechanism 4 of the used sputtering apparatus.
(1) Deposition speed: 0.01418 nm per second
(2) Target Mg film thickness: 0.2 nm
(3) Deposition time T: 14.1 seconds (0.2÷0.01418=14.1)
(4) Total whole number of rotations N: 23 rotations.
(5) Total number of rotations X and fractional number of rotations α
Example 1: Total number of rotations X=23.20 rotations, fractional number of rotations α=0.20 rotation (deviation angle β=72 degrees)
Example 2: Total number of rotations X=23.40 rotations, fractional number of rotations α=0.40 rotation (deviation angle β=144 degrees)
Example 3: Total number of rotations X=23.60 rotations, fractional number of rotations α=0.60 rotation (deviation angle β=216 degrees)
Example 4: Total number of rotations X=23.80 rotations, fractional number of rotations α=0.80 rotation (deviation angle β=288 degrees)
Comparative Example 1: Total number of rotations X=23.0 rotations, fractional number of rotations α=0 (deviation angle β=0 degree)
(6) Arrangement of sputtering cathode 103 and substrate support holder 106: Crossing angle θ=32.7 degrees, shift amount (l)=276 mm
(7) Power supply unit for sputtering cathode 3: DC power source 8 (power of 50 W)

Mg was deposited on the substrate 7 in Examples 1 to 4 and Comparative Example 1 as described below, except that the fractional number of rotations α was varied as shown in the above (5).

The values of the above conditions (3) to (5), namely the values of deposition time T, total whole number of rotations N and fractional number of rotations α, were inputted into the CPU 12 of the control unit 11. Calculation was made by the CPU 12 such that the rotational velocity V (rps) of the substrate support holder 6 met V·T=N+α, and based on the calculated result, the rotational velocity V of the rotation drive mechanism 4 was controlled together with the opening/closing action of the shutter 10 and the on/off operation of the DC power source 8.

First, a Si (silicon) wafer having a diameter of 300 mm was placed as the substrate 7 on the substrate support holder 6, and the interior of the vacuum vessel 1 was evacuated to $5.3 \times 10^{-7}$ Pa.

As the target 2, metal Mg having purity of 99.9% was used.

Then, Ar gas was introduced into the vacuum vessel 1 while evacuating the vacuum vessel 1 such that the vacuum vessel 1 had a low-pressure Ar gas atmosphere of 0.1 Pa therein.

When the Ar gas was introduced, the substrate support holder 6 was started to rotate, so that the substrate 7 was rotated together with the substrate support holder 6. This rotation was determined to have a constant rotational velocity V calculated from the values of the deposition time T, the total whole number of rotations N and the fractional number of rotations α.

The DC power source 8 was turned "on" with the shutter 10 in a closed state, and power controlled to constant power of 50 W was applied to the sputtering cathode 3 to start a discharge from the target 2 to generate plasma at the front surface of the target 2. The potential of the target against ground potential became negative, positive ions in the plasma entered the target 2, and sputtering of the target 2 of Mg was started.

In this state, the shutter 10 was operated to open, and Mg was started to deposit onto the substrate 7. After the sputtering particles of Mg were deposited on the substrate 7 for a given deposition time T only, the DC power source 8 was turned "off" to block the application of power to the sputtering cathode 3, and the Mg deposition was terminated. The deposition time T was from the termination of the opening operation of the shutter 10 to the turn "off" of the DC power source 8, and the deposition time T was set to 14.1 seconds as shown in the (3) above. During the deposition time T of 14.1 seconds, the substrate support holder 6 was continued to rotate at the rotational velocity V calculated as described above.

The obtained Mg film was measured for the Mg deposition amount, and the distribution of a deposition amount was measured. The deposition amount was measured by X-ray fluorescence analysis. For the distribution of a deposition amount, the deposition amounts at 17 points in an area excluding an outer peripheral portion of 5 mm of a Si wafer having a diameter of 300 mm were measured, and a value three times larger than a ratio of a standard deviation to the average value of the 17 deposition amounts was determined as a value of uniformity.

Figure 8:
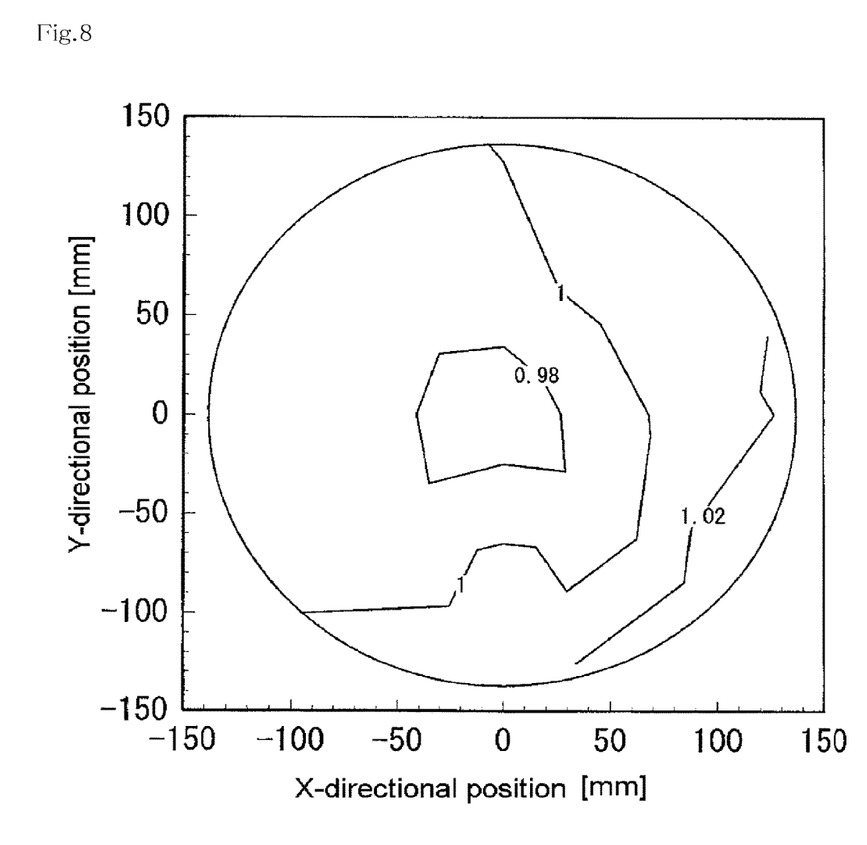
FIG. 8 is a diagram showing the distribution of a deposition amount of Mg of Example 4.
Figure 9:
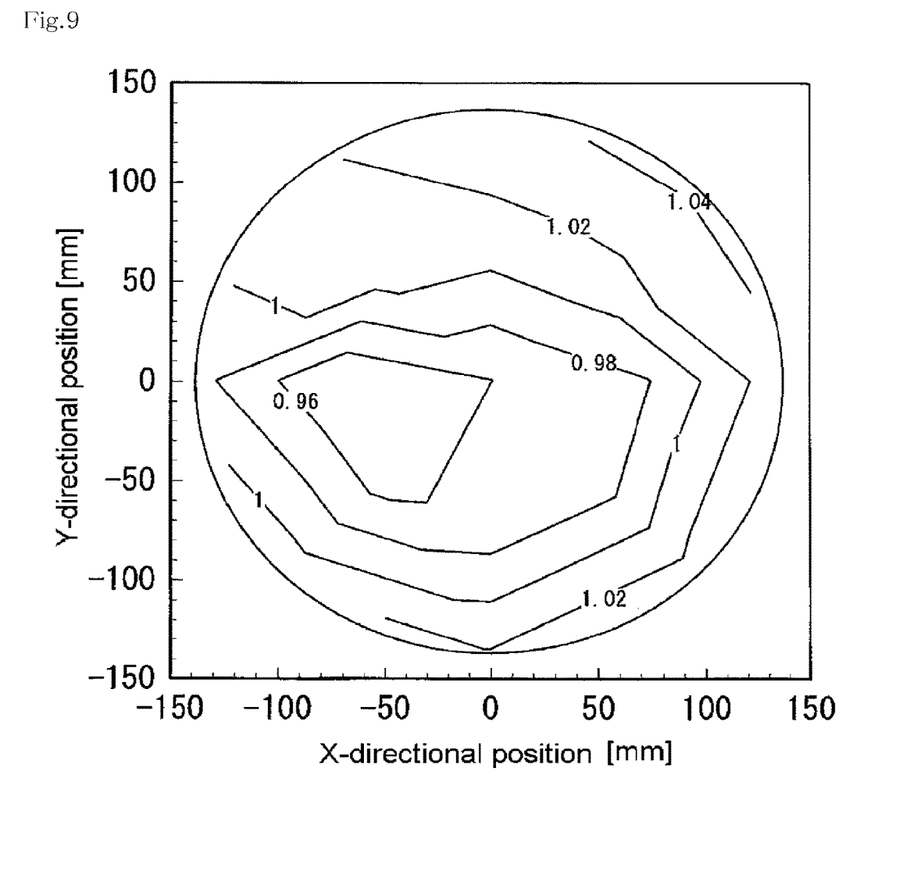
FIG. 9 is a diagram showing the distribution of a deposition amount of Mg of Comparative Example 1.

FIG. 8 shows the measured results of the distribution of a deposition amount of Mg when the film was formed in Example 4 [total number of rotations X=23.80 rotations, fractional number of rotations α=0.80 rotation (deviation angle β=288 degrees)], which were standardized and shown at a rate to the average value of the deposition amounts. FIG. 9 shows the measured results of the distribution of a deposition amount of Mg when the film was formed in Comparative Example 1 [total number of rotations X=23.0 rotations, fractional number of rotations α=0 (deviation angle β=0 degree)] which were standardized and shown at a rate to the average value of the deposition amounts. In addition, FIG. 10 is a graph showing a relationship between the deviation angle β (fractional number of rotations α) varied in Examples 1 to 4 and Comparative Example 1 and the uniformity of deposition amounts in the Mg films obtained in Examples 1 to 4 and Comparative Example 1.

Figure 10:
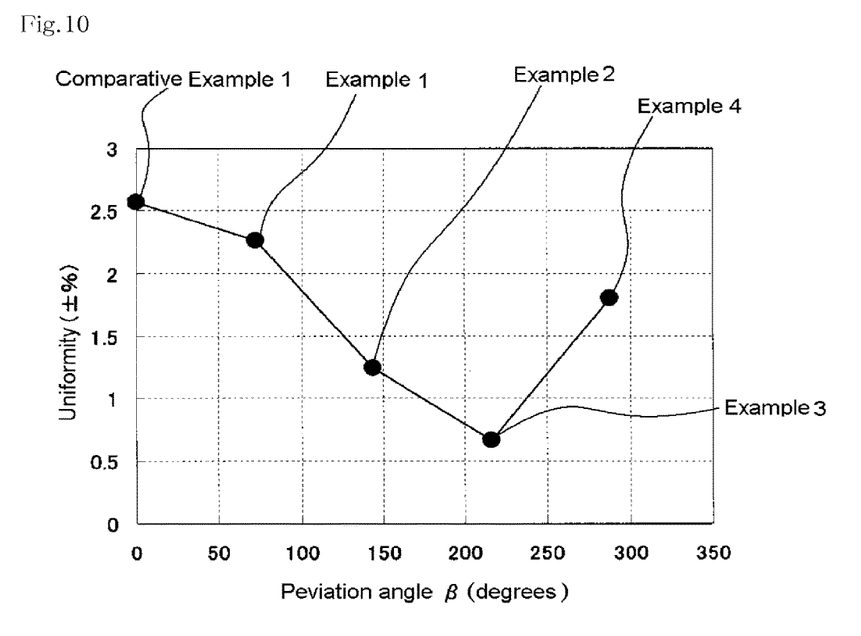
FIG. 10 is a graph showing relationships between deviation angles β (fractional numbers of rotations α) and uniformity of deposition amounts according to Examples 1 to 4 and Comparative Example 1.

It is seen from FIG. 8 to FIG. 10 that although the total whole number of rotations N is a small number of rotations such as 23 rotations and the deposition time T is also short such as 14.1 seconds, the distribution of the deposition amount can be suppressed by controlling to give the fractional number of rotations α of pure decimal, and the uniformity can be improved.

EXPLANATION OF REFERENCE NUMERALS

1: Vacuum vessel
2, 102: Target
3, 103: Sputtering cathode
4: Rotation drive mechanism
5: Rotating axis
6, 106: Substrate support holder
7, 107: Substrate
8: DC power source
9: Shutter drive mechanism
10: Shutter mechanism
11: Control unit (computer)
12: CPU (processing unit)
13: Recording medium
14: Input portion
a: Vertical line running through the center of a substrate among vertical lines with respect to a plane including a film forming surface
b: Vertical line running through the center of a target among vertical lines with respect to a plane including a film forming surface
c: Vertical line running through the center of a target among vertical lines with respect to a plane including a surface of the target
o: Center of substrate
p: Center of target
l: Shift amount
θ: Crossing angle

What is claimed is:

1. A sputtering method which uses a sputtering apparatus comprising a sputtering cathode supporting a target, a substrate support holder supporting a substrate and attached to a rotating axis perpendicular to the substrate, a rotation drive mechanism for rotating the substrate support holder attached to the rotating axis, and a control unit for controlling the rotation drive mechanism, where the sputtering cathode is provided so as to be inclined with respect to a surface of the substrate that is exposed to the target side and where the sputtering method deposits a forming material having a film thickness of 10 nm or less on a film forming surface of the substrate by introducing sputtering particles from the target toward the film forming surface of the substrate from an oblique direction with respect to the film forming surface, the method comprising the steps of:

a first step of generating plasma between the sputtering cathode and the substrate support holder in a fully closed state in which a shutter is disposed between the sputtering cathode and the substrate support holder by turning on a power supply means for supplying electric power to the sputtering cathode and supplying electric power to the sputtering electrode;

after the first step, a second step of moving the shutter from the fully closed state to a fully opened state such that the target is exposed on the substrate;

a third step of recording, in the control unit, a first digital value relating to a value of a deposition time T of the film forming material on the substrate, a second digital value relating to a value of a total whole number of rotations N of the substrate support holder, and a third digital value relating to a value of a fractional number of rotations a of the substrate support holder, N being a positive integer and a being a positive decimal number;

after the third step, a fourth step of calculating $X=N+\alpha$ and $V \cdot T=N+\alpha$ in the control unit based on the first, second and third digital values, where V is the rotational velocity of the substrate support holder and X is the total number of rotations of the substrate support holder;

a fifth step of rotating the substrate support holder while controlling the rotation drive mechanism using the control unit at the rotational velocity V, the total number of rotations X and the deposition time T satisfying the relationship of $X=N+\alpha$ and $V \cdot T=N+\alpha$ calculated in the fourth step; and after the fifth step, a sixth step of moving the shutter from the fully opened state to the fully closed state, wherein the deposition time T is determined by controlling the shutter using the control unit so that the shutter in the second step is in the fully opened state and the shutter in the sixth step is in the fully closed state.

2. The sputtering method according to claim 1, wherein the deposition time T is 1 to 400 seconds, the total whole number of rotations N is 1 to 100, and the rotational velocity V of the substrate support holder is 0.016 to 3.5 rps.

3. The sputtering method according to claim 1, wherein the deposition time T is 1 to 400 seconds, the total whole number of rotations N is 1 to 100, the rotational velocity V of the substrate support holder is 0.016 to 3.5 rps, and the fractional number of rotations a in a range of 0.2 to 0.8.

4. The sputtering method according to claim 1, wherein the deposition time T is a time from the start to end of supplying the power from the power supply means to the sputtering cathode.

5. The sputtering method according to claim 1, wherein the deposition time T is a time when the power is supplied from the power supply means to the sputtering cathode and the shutter is open.

6. The sputtering method according to claim 1, wherein the control unit has a CPU and a recording medium on which a control program is recorded, and wherein the method further comprises the step of:

reading the control program recorded on the recording medium to control the rotation drive mechanism to satisfy $X=N+\alpha$ and $V \cdot T=N+\alpha$.

7. The sputtering method according to claim 1, wherein the control unit controls to stop the power of the power supply means after the deposition time T has elapsed from the termination of the opening operation of the shutter.

8. The sputtering method according to claim 1, wherein the control unit controls to start a closing operation of the shutter after the deposition time T has elapsed from the termination of the opening operation of the shutter.

9. The sputtering method according to claim 1, wherein the deposition time T is a time from the termination of the opening operation of the shutter to the start of the closing operation of the shutter.

10. The sputtering method according to claim 1, wherein the deposition time T is from a time when the power supply means is operated to a time when the power supply means is stopped.

11. The sputtering method according to claim 1, wherein the deposition time T is a time from the termination of the opening operation of the shutter to a time when the power supply means is stopped before a closing operation is started.

12. The sputtering method according to claim 1, the method further comprising the step of:
   after the sixth step, a seventh step of turning off the power supply means and stopping power supplied to the sputtering cathode.

13. A sputtering method which uses a sputtering apparatus comprising a sputtering cathode for supporting a target, and a substrate support holder for supporting a substrate and attached to a rotating axis perpendicular to the substrate, a rotation drive mechanism for rotating the substrate support holder attached to the rotating axis, and a control unit for controlling the rotation drive mechanism, where the sputtering cathode is provided so as to be inclined with respect to a surface of the substrate that is exposed to the target side and where the sputtering method deposits a forming material having film thickness of 10 nm or less on a film forming surface of the substrate, by introducing sputtering particles from the target toward the film forming surface of the substrate from an oblique direction with respect to the film forming surface, the method comprising the steps of:
   a first step of generating plasma between the sputtering cathode and the substrate support holder, in a fully closed state in which a shutter is disposed between the sputtering cathode and the substrate support holder, by turning on a power supply means for supplying electric power to the sputtering cathode and supplying electric power to the sputtering cathode;
   after the first step, a second step of moving the shutter from the fully closed state to a fully opened state such that the target is exposed on the substrate;
   a third step of recording, in the control unit, a first digital value relating to a value of a deposition time T of the film forming material on the substrate, a second digital value relating to a value of a total whole number of rotations N of the substrate support holder, and a third digital value relating to a value of a fractional number of rotations a of the substrate support holder, N being a positive integer and α being a positive decimal number;
   after the third step, a fourth step of calculating $X=N+\alpha$ and $V \cdot T=N+\alpha$ in the control unit based on the first, second and third digital values, where V is the rotational velocity of the substrate support holder and X is the total number of rotations of the substrate support holder;
   a fifth step of rotating the substrate support holder while controlling the rotation driving mechanism using the control unit, at the rotational velocity V, the total number of rotations X and the deposition time T satisfying the relationship of $X=N+\alpha$ and $V \cdot T=N+\alpha$ calculated in the fourth step,
   after the fifth step, a sixth step of turning off the power supply means and stopping power supplied to the sputtering cathode; and
   after the sixth step, a seventh step of moving the shutter from the fully opened state to the fully closed state,
   wherein the deposition time T is determined by controlling the shutter using the control unit so that the shutter in the second step is in the fully opened state and the shutter in the seventh step is in the fully closed state.

14. A sputtering method which uses a sputtering apparatus comprising a sputtering cathode for supporting a target, and a substrate support holder for supporting a substrate and attached to a rotating axis perpendicular to the substrate, a rotation drive mechanism for rotating the substrate support holder attached to the rotating axis, and a control unit for controlling the rotation drive mechanism, where the sputtering cathode is provided so as to be inclined with respect to a surface of the substrate that is exposed to the target side and where the sputtering method deposits a forming material having film thickness of 10 nm or less on a film forming surface of the substrate, by introducing sputtering particles from the target toward the film forming surface of the substrate from an oblique direction with respect to the film forming surface, the method comprising the steps of:
   a first step of moving the shutter from a fully closed state in which a shutter is disposed between the sputtering cathode and the substrate support holder to a fully opened state such that the target is exposed on the substrate;
   after the first step, a second step of generating plasma between the sputtering cathode and the substrate support holder, by turning on a power supply means for supplying electric power to the sputtering cathode and supplying electric power to the sputtering cathode;
   a third step of recording, in the control unit, a first digital value relating to a value of a deposition time T of the film forming material on the substrate, a second digital value relating to a value of a total whole number of rotations N of the substrate support holder, and a third digital value relating to a value of a fractional number of rotations α of the substrate support holder, N being a positive integer and a being a positive decimal number;
   after the third step, a fourth step of calculating $X=N+\alpha$ and $V \cdot T=N+\alpha$ in the control unit based on the first, second and third digital values, where V is the rotational velocity of the substrate support holder and X is the total number of rotations of the substrate support holder;
   a fifth step of rotating the substrate support holder while controlling the rotation driving mechanism using the control unit, at the rotational velocity V, the total number of rotations X and the deposition time T satisfying the relationship of $X=N+\alpha$ and $V \cdot T=N+\alpha$ calculated in the fourth step; and
   after the fifth step, a sixth step of moving the shutter from the fully opened state to the fully closed state, wherein the deposition time T is determined by controlling the shutter using the control unit so that the shutter in the second step is in the fully opened state and the shutter in the sixth step is in the fully closed state.

15. The sputtering method according to claim 14, the method further comprising the step of:

after the sixth step, a seventh step of turning off the power supply means and stopping power supplied to the sputtering cathode.

* * * * *